United States Patent
Kitakado et al.

(10) Patent No.: US 6,709,902 B2
(45) Date of Patent: Mar. 23, 2004

(54) SEMICONDUCTOR DEVICE AND MANUFACTURING METHOD THEREOF

(75) Inventors: Hidehito Kitakado, Kanagawa (JP); Ritsuko Kawasaki, Kanagawa (JP); Kenji Kasahara, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 66 days.

(21) Appl. No.: 10/035,205

(22) Filed: Jan. 4, 2002

(65) Prior Publication Data

US 2002/0058364 A1 May 16, 2002

Related U.S. Application Data

(62) Division of application No. 09/541,608, filed on Apr. 3, 2000, now Pat. No. 6,346,730.

(30) Foreign Application Priority Data

Apr. 6, 1999 (JP) ............................................ 11-099481
Jun. 22, 1999 (JP) ............................................ 11-176120

(51) Int. Cl.⁷ ............................................... H01L 27/03
(52) U.S. Cl. ........................ 438/149; 438/166; 438/482
(58) Field of Search ................................ 438/145, 160, 438/164, 166, 799, 149, 482–491; 257/350, 59, 72, 344, 408; 349/43

(56) References Cited

U.S. PATENT DOCUMENTS

| | | | |
|---|---|---|---|
| 5,292,675 A | 3/1994 | Codama | |
| 5,323,042 A | 6/1994 | Matsumoto | |
| 5,643,826 A | 7/1997 | Ohtani et al. | |
| 5,923,962 A | 7/1999 | Ohtani et al. | |
| 6,091,115 A | * 7/2000 | Ohtani et al. | 257/369 |
| 6,096,581 A | * 8/2000 | Zhang et al. | 438/149 |
| 6,166,397 A | 12/2000 | Yamazaki et al. | |
| 6,166,414 A | 12/2000 | Miyazaki et al. | |
| 6,198,133 B1 | * 3/2001 | Yamazaki et al. | 257/347 |
| 6,218,678 B1 | * 4/2001 | Zhang et al. | 257/59 |
| 6,259,120 B1 | * 7/2001 | Zhang et al. | 257/72 |
| 6,281,552 B1 | * 8/2001 | Kawasaki et al. | 257/350 |
| 6,346,730 B1 | * 2/2002 | Kitakado et al. | 257/350 |
| 6,362,507 B1 | * 3/2002 | Ogawa et al. | 257/350 |
| 6,380,007 B1 | * 4/2002 | Koyama | 438/151 |
| 6,410,368 B1 | * 6/2002 | Kawasaki et al. | 438/145 |
| 6,420,988 B1 | * 7/2002 | Azami et al. | 341/144 |

(List continued on next page.)

FOREIGN PATENT DOCUMENTS

| | | | |
|---|---|---|---|
| JP | 7-130652 A | 5/1995 | |
| JP | 2564725 B2 | 10/1996 | |

OTHER PUBLICATIONS

Hatano et al., "A Novel Self–aligned Gate–overlapped LDD Poly–Si TFT with High Reliability and Performance", IDEM Technical Digest 97, pp. 523–526.

*Primary Examiner*—Carl Whitehead, Jr.
*Assistant Examiner*—Laura M Schillinger
(74) *Attorney, Agent, or Firm*—Nixon Peabody LLP; Jeffrey L. Costellia

(57) ABSTRACT

The present invention provides a semiconductor device in which a bottom-gate TFT or an inverted stagger TFT arranged in each circuit is suitably constructed in conformity with the functionality of the respective circuits, thereby attaining an improvement in the operating efficiency and reliability of the semiconductor device. In the structure, LDD regions in a pixel TFT are arranged so as not to overlap with a channel protection insulating film and to overlap with a gate electrode by at least a portion thereof. LDD regions in an N-channel TFT of a drive circuit is arranged so as not to overlap with a channel protection insulating film and to overlap with a gate electrode by at least a portion thereof. LDD regions in a P-channel TFT of the drive circuit is arranged so as to overlap with a channel protection insulating film and to overlap with the gate electrode.

14 Claims, 13 Drawing Sheets

U.S. PATENT DOCUMENTS 6,461,899 B1 * 10/2002 Kitakado et al. ............ 438/149
6,469,317 B1 * 10/2002 Yamazaki et al. ............ 257/59
6,492,681 B2 * 12/2002 Koyama et al. ............ 257/347
6,498,369 B1 * 12/2002 Yamazaki et al. .......... 257/347
6,506,636 B2 * 1/2003 Yamazaki et al. .......... 438/149
6,563,482 B1 * 5/2003 Yamazaki et al. ............ 345/87
6,580,475 B2 * 6/2003 Yamazaki et al. ............ 349/43

* cited by examiner

SEMICONDUCTOR DEVICE AND MANUFACTURING METHOD THEREOF

BACKGROUND OF THE INVENTION

1. Field of the Invention

The present invention relates to a manufacturing method of a semiconductor device having a circuit in which a thin film transistor (hereinafter referred to as TFT) is formed on a substrate having an insulating surface. More particularly, the present invention is suitable for use in an electro-optical device typically known as a liquid crystal display device having a pixel TFT formed in a display region and a drive circuit formed in the periphery of the display region on the same substrate, and in an electronic equipment mounted with an electro-optical device with this type. Note that throughout the specification of the present invention, the semiconductor device indicates any device utilizing the semiconductor characteristics for functioning, and includes the foregoing electro-optical device and an electronic equipment mounted with the electro-optical device in its category.

2. Description of the Related Art

From the fact that a TFT having an active layer formed of a crystalline silicon film on a substrate having an insulating surface (hereinafter referred as a crystalline silicon TFT) has a high electric field effect mobility, it is possible to form a variety of functional circuits. The above electro-optical device having such functional circuits integrally formed on the same substrate has been developed. As a typical example, the active matrix liquid crystal display device is well known.

In the active matrix liquid crystal device employing the crystalline silicon TFT, a pixel TFT is formed in every pixel of an image display region and a drive circuit is formed in the periphery of the image display region. The drive circuit is composed of a shift resister circuit, a level shifter circuit, a buffer circuit, a sampling circuit, and the like in which a CMOS circuit as a basic circuit is formed. These circuits are formed on the same substrate, and formed into a unity to complete a display device.

The operating conditions of the pixel TFT and the drive circuit are not necessarily the same. From this, the characteristics that are demanded for a TFT is somewhat different. For example, the pixel TFT is demanded to function as a switch device for applying a voltage to a liquid crystal. The liquid crystal is driven by an a.c., thus a method called frame inverse drive is widely adopted. In this method, for the purpose of maintaining an electric charge of a storage capacitor, the characteristic that is demanded for the pixel TFT was to sufficiently lower an off-current value (a drain current that flows during an off-operation of TFT). On the other hand, since a high drive voltage is applied to the buffer circuit of the drive circuit, it was necessary to raise the voltage-resistance of the TFT so that it will not break when a high voltage is applied. Also, in order to make a current drive ability higher, it was necessary to sufficiently secure an on-current value (a drain current that flows during an on-operation of TFT.

However, the point at issue is that the off-current value of the crystalline silicon TFT easily rises. Moreover, similar to an MOS transistor used in an IC and the like, a deterioration phenomenon such as a drop of the on-current value is observed on the crystalline silicon TFT. This mainly results from a hot carrier implantation. It has been considered that the hot carrier generated by a high electric field in the vicinity of the drain triggers the deterioration phenomenon.

As a structure of the TFT to reduce the off-current value, an LDD region (Lightly Doped Drain) is known. In this structure, there is provided a region that is added with an impurity element at a low concentration between a channel forming region and a source region or a drain region which is formed by adding an impurity element at a high concentration, and this region is called the LDD region.

For example, Japanese Patent No. 2564725 discloses a method of manufacturing a TFT having an LDD region. In this method, a gate insulating film is formed widely in the direction of a channel width from a gate electrode, and an insulating film thinner than the gate insulating film is further formed beside this gate insulating film. Then by utilizing the difference in the thickness between this insulating film and the gate insulating film, an LDD region is formed in a semiconductor film between the end portion of the gate electrode and a source or drain region.

Moreover, as means for preventing deterioration caused by a hot carrier, a so-called GOLD (Gate-drain Overlapped LDD) structure is known in which the LDD region is arranged so as overlapping the gate electrode via the gate insulating film. With a structure of this kind, the high electric field in the vicinity of a drain is relaxed to prevent hot carrier implantation, which is effective for prevention of the deterioration phenomenon. For example, though a GOLD structure formed by a side wall which is formed of silicon is disclosed by Mutuko Hatano, Hajime Akimoto and Takeshi Sakai, in "IEDM97 TECHNICAL DIGEST, p523–526, 1997," it has been confirmed that an extremely excellent reliability can be achieved when compared with TFTs of other structures.

It had been preferred that the introduction of an impurity element to the semiconductor layer, which is used to form an impurity region such as the LDD region, the source or drain region of the TFT having such a structure, be conducted in a self-aligning manner utilizing the gate electrode and the insulating film for a mask provided on the semiconductor layer. Furthermore, in order to reduce the number of masks, a method (referred as cross dope method in the present invention) has been employed in which once an impurity element of a one conductive type is introduced into the whole surface by utilizing the gate electrode and the insulating film as a mask, an impurity element of a conductive type opposite the one conductive type is introduced into the impurity region of a TFT of either the P-channel TFT or the N-channel TFT at a high concentration.

However, the characteristics being demanded for the pixel TFT and the TFT of the drive circuit such as a shift resist circuit, or a buffer circuit are not necessarily the same. For example, in the pixel TFT, a large reversal bias (negative voltage in an N-channel TFT) is applied to a gate, whereas the TFT of the drive circuit basically does not operate in the reversal bias state. Also, the operating velocity of the pixel TFT can be $\frac{1}{100}$ of less than that of the TFT of the drive circuit.

The GOLD structure is highly effective in preventing the deterioration of the on-current value, but on the other hand, there arises a problem in that the off-current becomes higher compared with the structure of a normal LDD. Therefore, the GOLD structure was not a preferred structure for applying to the pixel TFT. Contrarily, although the structure of a normal LDD is highly effective in suppressing the off-current value, it has a low effect in relaxing the electric field in the vicinity of a drain and in preventing deterioration caused by the hot carrier implantation. In this way, in a semiconductor device such as the active matrix liquid crystal display device that has a multiple of integrated circuits of different operating conditions, it was not always desirable to form all the TFTs with the same structure. Such a point of issue like has been revealed as an enhanced characteristic is required for the crystalline silicon TFT in particular, and as the performance demanded of the active matrix liquid crystal display device becomes increased.

Furthermore, although there are several means to decrease the off-current value of the TFT, it was necessary to form a good junction of the channel forming region and the impurity region (LDD region, source region or drain region). In order to do this, the distribution of an impurity element in the interface of the channel forming region and the impurity region that contacts the channel forming region needs to be accurately controlled. However, when the above-mentioned cross dope method is implemented, the distribution of an impurity element in the interface was difficult to control accurately since an impurity element of a one conductive type and an impurity element of a conductive type opposite the one conductive type were introduced into the impurity region of the TFT on one side.

This type of LDD structure is formed by focusing on the characteristic of the N-channel TFT. Many of the P-channel TFTs, which are formed on the same substrate to form the CMOS circuit or the like, were formed as a single drain structure for the purpose of lessening the number of masks as much as possible. In this case, there arises a problem in that since phosphorous (P) for forming an LDD in the N-channel TFT is doped into the source or drain region in the P-channel TFT, a defect is formed in the junction with the channel forming region and the off-current value increases.

SUMMARY OF THE INVENTION

A technique of the present invention is for solving the above problems, and therefore it is an object of the present invention to provide a TFT, which is to be arranged in every circuit of the semiconductor device, having an appropriate structure in accordance with a function of a circuit, to thereby improve operating characteristics and reliability of a semiconductor device.

In order to solve the above problems, according to one aspect of the present invention, there is provided a semiconductor device having a pixel TFT formed in a display region and a TFT of a drive circuit formed in the periphery of the display region on the same substrate, characterized in that: each of the pixel TFT and the TFT of drive circuit has an active layer, an LDD region formed in the active layer, a gate insulating film provided between the active layer and the substrate, and a gate electrode provided between the gate insulating film and the substrate; at least a portion of each LDD region in the pixel TFT or an N-channel TFT of the drive circuit is arranged so as to overlap with the gate electrode; and an LDD region in a P-channel TFT of the drive circuit is arranged so as to overlap with a gate electrode in the P-channel TFT. Also, it is preferable that an LDD region in each of the pixel TFT and the N-channel TFT of the drive circuit is arranged so as not to overlap with a channel protection insulating film, and to overlap with a gate electrode by at least a portion thereof; and an LDD region in a P-channel TFT of the drive circuit is arranged so as to overlap with a channel protection insulating film in the P-channel TFT of the drive circuit, and to overlap with a gate electrode in the P-channel TFT.

Further, according to another aspect of the present invention, a P-channel TFT of the drive circuit has a first impurity region containing therein both an impurity element that gives p-type and an impurity element that gives n-type and a second impurity region containing therein an impurity element that gives p-type, and is characterized in that the second impurity region is formed between the first impurity region and an LDD region in the P-channel TFT of the drive circuit.

This is so constructed that phosphorous that is doped into a source or drain region of a P-channel TFT is not doped into the junction with the channel forming region without increasing the number of masks, attaining a reduction of an off-current value.

A storage capacitor connected to the pixel TFT includes a capacitor wiring formed over the substrate, an insulating film formed on the capacitor wiring, and a semiconductor layer formed on the insulating film. Alternatively, an organic resin film is formed on the pixel TFT, and a capacitor includes a light shielding film formed on the organic resin film, a dielectric film formed closely to the light shielding film, and a pixel electrode connected to the pixel TFT, a portion of which overlaps with the light shielding film.

Moreover, in order to solve the above problems, the present invention provides a method of manufacturing a semiconductor device having a pixel TFT formed in a display region and a TFT of a drive circuit formed in the periphery of the display region on the same substrate, the method comprising the steps of: forming an LDD region in the pixel TFT or an N-channel TFT of the drive circuit at least a portion of which overlaps with a gate electrode; and forming an LDD region in a P-channel TFT of the drive circuit that overlaps a gate electrode in the P-channel TFT. Further, the method may comprises the steps of: forming an LDD region in the pixel TFT and an N-channel TFT of the drive circuit so as not to overlap with a channel protection insulating film, and to overlap with a gate electrode by at least a portion thereof; and forming an LDD region in a P-channel TFT of the drive circuit in a manner so as to overlap with a channel protection insulating film in the P-channel TFT, and to overlap with the gate electrode in the P-channel TFT.

The above method of manufacturing a semiconductor device further comprises the step of: forming a first impurity region containing therein both an impurity element that gives p-type and an impurity element that gives n-type therein and a second impurity region containing therein an impurity element that gives p-type therein in the P-channel TFT of the drive circuit, and the second impurity region is preferably formed between the first impurity region and an LDD region in the P-channel TFT of the drive circuit.

Further, according to another aspect of the present invention, a method of manufacturing a semiconductor device having a pixel TFT formed in a display region and a TFT of a drive circuit formed in the periphery of the display region on the same substrate is characterized in that the method comprises: a first step of forming gate electrodes on a substrate; a second step of forming a gate insulating film on the gate electrodes; a third step of semiconductor layers on the gate insulating film; a fourth step of forming channel protection films on the semiconductor layers; a fifth step of introducing an impurity element that gives n-type into the semiconductor layers, and forming LDD regions in an N-channel TFT that does not overlap with the channel protection films; a sixth step of introducing an impurity element that gives n-type into the semiconductor layers, and forming a source region or a drain region on the N-channel TFT; and a seventh step of introducing an impurity element that gives p-type into one of the semiconductor layers, and forming an LDD region, and a source region or a drain region in the P-channel TFT that overlaps with the channel protection film.

The above method of manufacturing a semiconductor device is characterized by further comprising the steps of: forming a capacitor wiring on the substrate; forming an insulating layer on the capacitor wiring; forming a semiconductor layer on the insulating layer; and forming a storage capacitor connected to the pixel TFT. The method further comprises the steps of: forming an organic resin film on the pixel TFT; forming a light shielding film on the organic resin film; forming a dielectric film on the light shielding film; and forming a pixel electrode connected to the pixel TFT, a portion of which overlaps with the light shielding film; forming a capacitor therefrom. The light shielding film is formed of one or plural kinds of materials selected from aluminum, tantalum, and titanium, and the dielectric film is preferably formed of an oxide of a material which the light shielding film is formed of. Most preferably, this oxide is formed by anodic oxidation.

BRIEF DESCRIPTION OF THE DRAWINGS

These and other objects of the subject invention will become more fully apparent as the following description is read in light of the attached drawings wherein.

DETAILED DESCRIPTION OF THE PREFERRED EMBODIMENTS

Hereinafter, preferred embodiment modes of the present invention will be explained in detail as indicated in the following embodiments.

Embodiment 1

A description of a preferred embodiment of the present invention will be given with reference to FIGS. 1A through 3. Here, a description of a method of simultaneously manufacturing a pixel TFT in a display region and a TFT of a drive circuit formed in the periphery of the display region will be explained in detail by following a process.

Figure 1A:
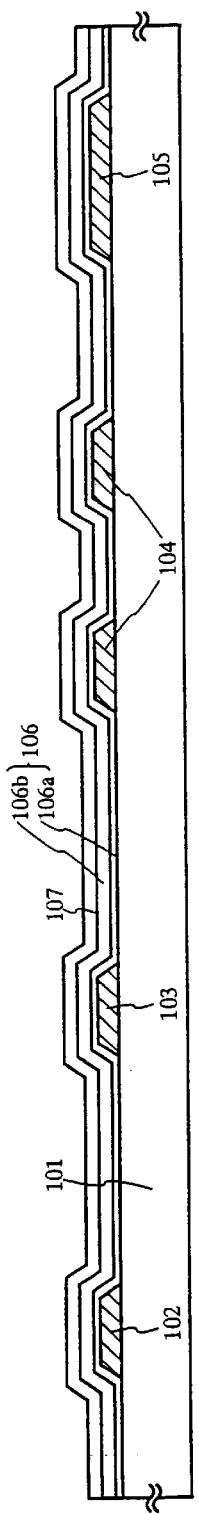
FIGS. 1A–1C are diagrams illustrating a manufacturing process of a pixel TFT and a TFT of a drive circuit of Embodiment 1.

In FIG. 1A, a low alkali glass substrate or a quartz substrate can be used as a substrate 101. On the surface of the substrate 101 where a TFT is formed, an insulating film such as a silicon oxide film, a silicon nitride film, or a silicon oxide nitride film can be formed (not shown). Gate electrodes 102 through 104 and a capacitor wiring 105 are formed by employing materials containing an element selected from tantalum (Ta), titanium (Ti), tungsten (W), molybdenum (Mo), and aluminum (Al) or having one of these elements as a main component and are coated by utilizing well-known film formation methods such as sputtering and vacuum evaporation. Then, etching and patterning is carried out so that the end surface is tapered. For example, after forming the Ta film at a thickness of 200 nm by sputtering, and forming a resist mask into a predetermined shape, a plasma etching is performed with mixed gas of $CF_4$ and $O_2$ to make a desired shape. Also, a gate electrode can be a two-layer structure (not shown) composed of tantalum nitride (TaN) and Ta, or tungsten nitride (WN) and W. Although not shown in the figures, a gate wiring connected to the gate electrode is formed at the same time.

A gate insulating film 106 is formed of a material having a silicon oxide and silicon nitride as constituents at a thickness of 10 to 200 nm, preferably 50 to 150 nm. For example, a laminated layer formed of a silicon nitride film 106a made of $SiH_4$, $NH_3$, and $N_2$ as raw materials having a thickness of 50 nm having and a silicon oxide nitride film 106b with a thickness of 75 nm having $SiH_4$ and $N_2O$ as raw material by plasma CVD can be the gate insulating film. Of course, the gate insulating film 106 can be a single layer made up of a silicon nitride film or a silicon oxide film. Further, in order to obtain a clean surface, it is better to implement plasma hydrogenate before forming the film of the gate insulating film.

Next, the formation of a crystalline semiconductor film that becomes an active layer of a TFT is performed. Silicon is used as the material for the crystalline semiconductor film. First, an amorphous silicon film is formed at a thickness of 20 to 150 nm by a well-known film formation method such as plasma CVD or sputtering so as to be close to the gate insulating film 106. Although the manufacturing conditions of an amorphous silicon film is not restricted by anything, it is desired that the concentration of impurity elements of oxygen and nitrogen contained in the film be reduced to $5 \times 10^{18}$ $cm^{-3}$ or less. Since the gate insulating film and the amorphous silicon film can be formed with the same film formation method, both may be continuously formed. After forming the gate insulating film, contamination on the surface can be prevented by not exposing it in the atmosphere once and characteristic unevenness and fluctuation of a threshold voltage of a TFT manufactured can be reduced. A crystalline silicon film 107 is thereafter formed by employing a well-known crystallization technique. For example, the crystalline silicon film 107 can also be formed by a crystallization method using a catalytic element such as laser crystallization, or thermal crystallization (solid phase crystallization), or by following a technique disclosed in Japanese Patent Application Laid-Open No. Hei 7-130652.

In the region where the N-channel TFT of the crystalline silicon film 107 is formed, boron (B) may be added at a level of approximately $1\times10^{16}$ to $5\times10^{17}$ cm$^{-3}$ in order to control a threshold voltage. The adding of boron (B) may be implemented by an ion dope method or may be added at the same time when forming the amorphous silicon film (FIG. 1A).

Next, the adding of an impurity element that gives n-type is performed for the purpose of forming an LDD region in the N-channel TFT. First, a mask insulating film 108 made of a silicon oxide film and a silicon nitride film is formed at a thickness of 100 to 200 nm, typically 120 nm, on the surface of the crystalline silicon film 107. And a photoresist film in entirely formed on this surface. Thereafter, the photoresist film is exposed using gate electrodes 102 through 104 as masks by an exposure from the back surface of the substrate 101 to thereby form resist masks 109 through 112. Through this method, resist masks can be formed on the gate electrodes and within the gate electrodes.

Figure 1B:
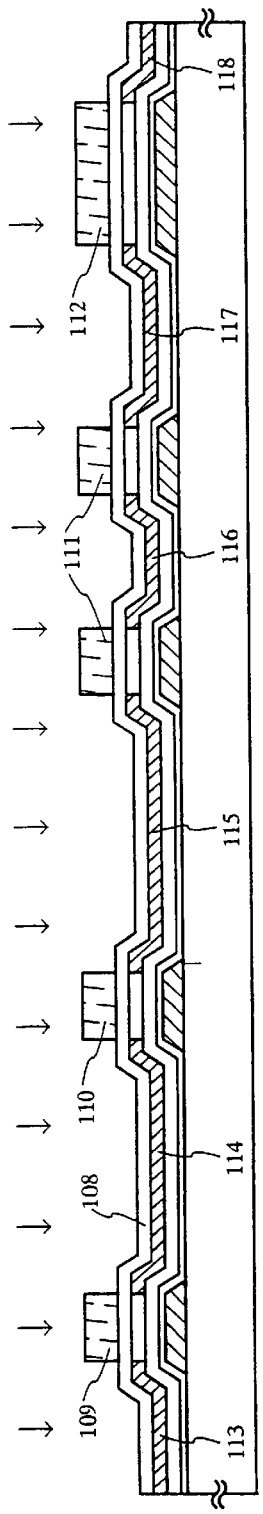

Then, an impurity element that gives the n-type is doped via the mask insulating film 108 into the crystalline silicon film underlying it by an ion doping method (an ion implantation method can also be used). In the technical field of semiconductors, applicable impurity elements that give n-type include the elements from the periodic table group 15 such as phosphorous (P), arsenic (As), and antimony (Sb). In this case, phosphorous (P) is used. The concentration of phosphorous (P) added into impurity regions 113 through 118 that are thus formed is preferably in the range of $1\times10^{17}$ to $5\times10^{18}$ cm$^{-3}$, and here, it is $5\times10^{17}$ cm$^{-3}$. The present invention expresses the concentration of the impurity element that gives n-type included in the impurity regions 113 through 118 as "n" (FIG. 1B).

Figure 1C:
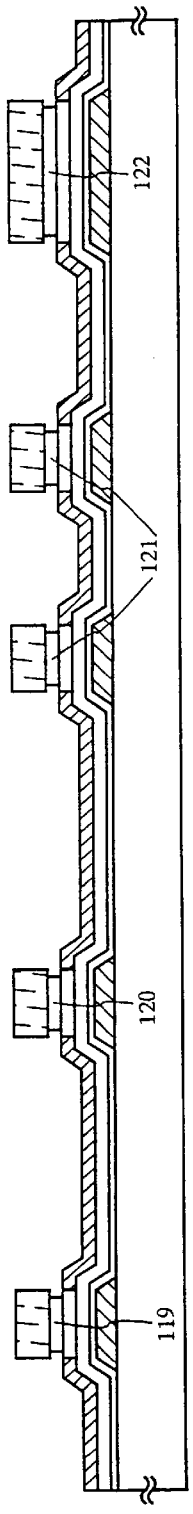

Next, the mask insulating film 108 is removed by etching using this resist mask and channel protection films 119 through 122 are formed. For the purpose of conducting a better choice of etching the mask insulating film 108 with respect to the crystalline silicon film 107 as an underlying film, a wet etching method using fluorine solution is adopted here. Of course, dry etching can be implemented, for instance, the insulating film 108 may be etched by using CHF$_3$. In any case, the process here is to conduct overetching so that the channel protection films 119 through 122 can be formed further inside than the end surface of the resist masks 109 through 112 (FIG. 1C).

Figure 2A:
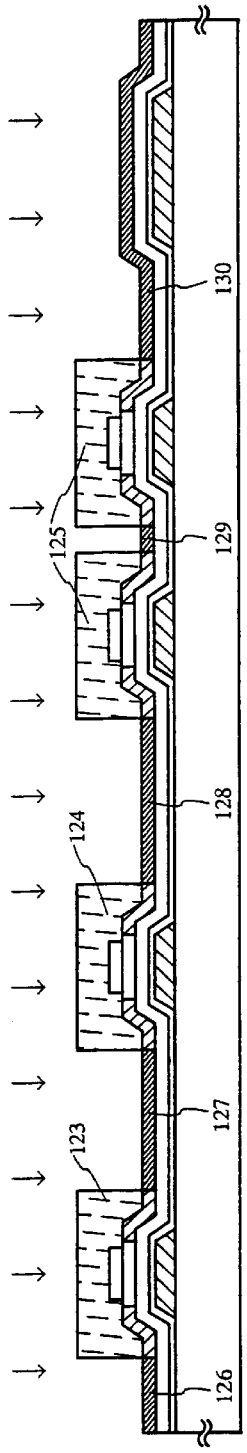
FIGS. 2A–2C are diagrams illustrating a manufacturing process of a pixel TFT and a TFT of a drive circuit of Embodiment 1.
Figure 2B:
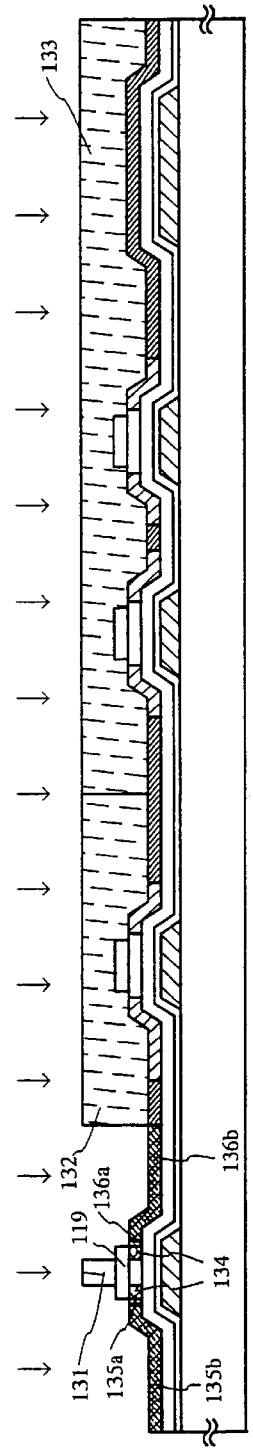

A process of forming an impurity region to function as a source region or a drain region in the N-channel TFT is performed next. In this process, masks 123 through 125 are formed by a normal exposure method using a resist. Then, the channel protection film 122 on the capacitor wiring 105 is etched and removed by using the thus formed resist masks. Subsequently, impurity regions 126 through 130 into which an impurity element that gives n-type has been added are formed by an ion doping method (an ion implantation method can also be used) on the crystalline silicon film 107. Here, in the impurity regions 126 through 130, the impurity element is included at a concentration of $5\times10^{20}$ cm$^{-3}$, though it can be $1\times10^{20}$ to $1\times10^{21}$ cm$^{-3}$. The present invention expresses this concentration as "n$^+$" (FIG. 2A).

A process of adding an impurity element that gives p-type is performed for the purpose of forming a source region or a drain region in the P-channel TFT of the drive circuit. In the technical field of semiconductors, applicable semiconductor elements that give p-type include the element from the periodic table group 13 such as boron (B), aluminum (Al), and gallium (Ga), and here, boron is used. A mask 131 is formed so that it is positioned on the inside of the channel protection film 119, and resist masks 132 and 133 are formed so as to cover the entire region where the N-channel TFTs are formed. Impurity regions 134 though 136 are thereafter formed by an ion doping method (an ion implantation method can also be used) using diborane (B$_2$H$_6$). An impurity element is added from the surface of the crystalline silicon film into the impurity regions 135a, 135b, 136a and 136b. The concentration of boron in the regions is in the range of $1.5\times10^{20}$ to $3\times10^{21}$ cm$^{-3}$, here it is $2\times10^{21}$ cm$^{-3}$. The present invention expresses the concentration of the impurity element that gives p-type included in the impurity regions 135a, 135b, 136a, and 136b as "p$^+$". On the other hand, since the crystalline silicon film is added with an impurity element via the channel protection film 119, the concentration of boron (B) became $1\times10^{16}$ to $1\times10^{18}$ cm$^{-3}$ in this impurity region 134. The present invention expresses the concentration of the impurity element that gives p-type included in the impurity region 134 that is thus formed in this process as "p$^-$".

As shown in FIGS. 1B to 2A, the impurity regions 135b and 136b are added with phosphorous (P) in the previous process, and therefore a region containing a mixture of boron (B) and phosphorous (P) is formed. However, by adding boron (B) at a concentration of 1.5 to 3 times higher in this process, p-type conductivity can be secured and no influence is inflicted upon the characteristics of the TFT. The present invention indicates these regions as an impurity region "B". Also, the impurity regions 135a and 136a at the side of the channel forming region of the impurity regions "B" 135b and 136b contain boron (B) only, and the present invention indicates these regions as an impurity region "A". The impurity region 134 overlapping the gate electrode 103 as well as the channel protection film 120 is also formed as a region containing boron (B) only and functions as an LDD region (FIG. 2B).

Respective impurity elements are selectively added into the crystalline silicon film and then etching is carried out on this crystalline silicon film so that it is divided into island-like films. Then a protection insulating film 137, which will later become a portion of a first interlayer insulating film, is formed. The protection insulating film 137 can be formed of a silicon nitride film, a silicon oxide film, a silicon oxide nitride film, or a lamination film of the combination thereof and may be at a thickness of 100 to 400 nm.

Thereafter, the heat treatment process is carried out for the purpose of activating the impurity elements giving either an n-type or p-type that have been doped at respective concentrations. This process can be carried out by annealing methods such as furnace annealing, laser annealing, or rapid thermal annealing (RTA). Here, activation is carried out by furnace annealing. Heat treatment is performed at 300 to 650° C., preferably 500 to 550° C. in a nitrogenic atmosphere. In this process, heat treatment was performed at 525° C. for 4 hours. Then heat treatment is further performed at 300 to 450° C. for 1 to 12 hours in an atmosphere containing 3 to 100% of hydrogen and then hydrogenation is carried out on the active layer. This process is to terminate the dangling bonds in the active layer by thermally excited hydrogen. As other hydrogenation means, plasma hydrogenation (using hydrogen excited by plasma) can be performed.

Figure 2C:
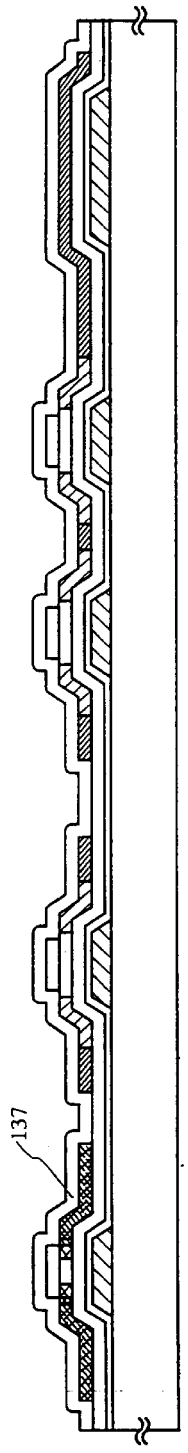

When the crystalline silicon film 107, which becomes the active layer, is fabricated by a crystallization method using a catalytic element from an amorphous silicon film, the amount of catalytic element remaining in the crystalline silicon film 107 is approximately $1\times10^{17}$ to $5\times10^{19}$ cm$^{-3}$. Of course, there is no problem in completing and operating the TFT in this situation. However, it is more preferable that the residual catalytic element be removed at least from the channel forming region. One of the means of removing this catalytic element is to utilize the gettering action of phosphorous (P). The concentration of phosphorous (P) necessary in the gettering process is approximately the same as that of impurity region (n$^+$) formed in FIG. 2B. Through the heat treatment in the activation process that is implemented here, the catalytic element can be gettered from the channel forming region in the N-channel TFT and the P-channel TFT to the impurity regions in the periphery where phosphorous (P) has been doped. As a result, the concentration of the catalytic element in the channel forming region can be made to be $5\times10^{17}$ cm$^{-3}$ or less. The catalytic element having a concentration of $1\times10^{18}$ to $5\times10^{20}$ cm$^{-3}$ has segregated to the above impurity region (FIG. 2C).

After completing the activation process, an interlayer insulating film 138 is formed at a thickness of 500 to 1500 nm on the protection insulating film 137. A first interlayer insulating film is a lamination film formed of the above protection insulating film 137 and the interlayer insulating film 138. A contact hole that reaches the source region or drain region of the respective TFTs is formed, and then source wirings 139 through 141 and drain wirings 142 and 143 are formed. Although not shown in the figure, this electrode according to the present embodiment is laminated film of a 3-layered structure formed of a 100 nm Ti film, a 300 nm aluminum film containing Ti, and a 150 nm Ti film by sputtering in successions.

The protection insulating film 137 and the interlayer insulating film 138 can be formed of a silicon nitride film, a silicon oxide film or a silicon oxide nitride film, or the like. In any case, it is better that the internal stress of the film be made into the compression stress.

Next, using a silicon nitride film, a silicon oxide film, or a silicon oxide nitride film, a passivation film 144 is formed at a thickness of 50 to 500 nm (typically 100 to 300 nm). If hydrogenation process is carried out in this state, desirable effects can be achieved with respect to an improvement in the characteristics of TFTs. For instance, it is appropriate that heat treatment is performed at 300 to 450° C. in an atmosphere containing 3 to 100% of hydrogen for 1 to 12 hours or similar effects can be obtained if a plasma hydrogenation method employed. Moreover, at the position of forming a contact hole for connecting a pixel electrode to the drain wiring in a later process, an opening portion can be formed in the passivation film 144.

Then a second interlayer insulating film 145 formed of an organic resin film is formed at about 1i m of thickness. Polyimide, acryl, polyamide, polyimide-amide, BCB (benzocyclobutene), etc. are applicable as inorganic resin materials. Here, after coating the substrate, the second interlayer insulating film 145 is formed by baking at 300° C. using a type of polyimide that is thermal polymeric. Then, a contact hole that reaches the drain wiring 143 is formed in the second interlayer insulating film 145 and the passivation film 144, on to which a pixel electrode 146 is provided. If the pixel electrode 146 is used in transmission type liquid crystal display devices, a transparent conductive film can be used. On the other hand, if it is used in reflection type liquid crystal display devices, a metallic film can be used. Here the pixel electrode is used in a transmission type liquid crystal device; therefore an indium tin oxide (ITO) film is formed at a thickness of 100 nm by sputtering. A pixel electrode 190 is the electrode of a neighboring pixel.

Figure 3:
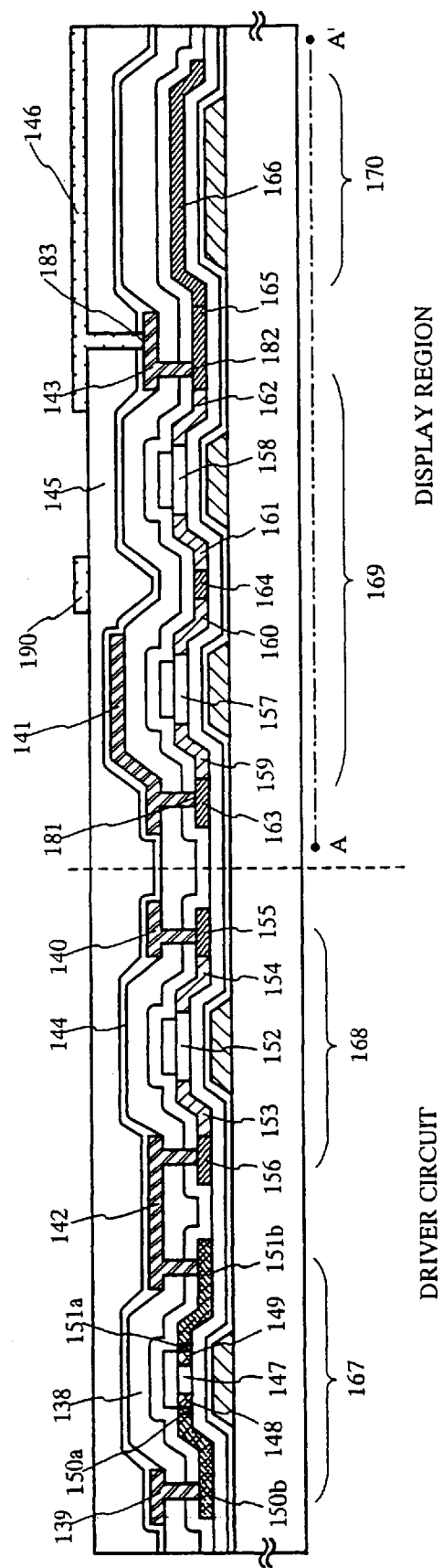
FIG. 3 is a diagram illustrating a manufacturing process of a pixel TFT and a TFT of a drive circuit of Embodiment 1.

Through the above processes, the pixel TFT in a display region and the TFT of the drive circuit in the periphery of the display region can be formed on the same substrate. In the drive circuit, an N-channel TFT 168 and a P-channel TFT 167 are formed, allowing for a logic circuit structured with a CMOS circuit as the basic circuit. A pixel TFT 169 is an N-channel TFT, and furthermore, from the capacitor wiring 105, a semiconductor layer 166, and an insulating layer formed therebetween, a storage capacitor 170 is connected to this pixel TFT 169 (FIG. 3).

A P-channel TFT 167 of the drive circuit has a channel forming region 147, source regions 150*a* and 150*b*, drain regions 151*a* and 151*b*, and LDD regions 148 and 149. The source region 150*b* and the drain region 151*b* are formed as the impurity region "B". The concentration of boron (B) in this region is 1.5 to 3 times higher than the concentration of phosphorous (P). On the inside of the impurity region "B", that is, the source region 150*a* and the drain region 151*a* formed on the side of the channel forming region 147 correspond to the impurity region "A". This impurity region "A" is a region containing only boron at the same concentration as that of the impurity region "B". Further, the LDD regions 148 and 149 overlapping the gate electrode 103 as well as the channel protection film 120 are also formed as regions containing only boron (B). By separating the impurity region "B" from the channel forming region in this way, the reliable junctions between N-channel forming region and the LDD region that comes in contact with the channel forming region, and still further between the LDD region and either the source region or the drain region are attained, enabling the characteristics of the P-channel TFT well retained.

An N-channel TFT 168 of the drive circuit has a channel forming region 152, a source region 155 and a drain region 156, and LDD regions 153 and 154. The pixel TFT 169 has channel forming regions 157 and 158, source regions or drain regions 163 through 165, and LDD regions 159 through 162. The LDD regions in the N-channel TFT of the drive circuit are provided for the principal purpose of relaxing a high electric field in the vicinity of the drain to prevent the deterioration of the on-current value due to hot carrier implantation. Thus, it is appropriate to set the concentration of a suitable impurity element that gives n-type to $5\times10^{17}$ to $5\times10^{18}$ cm$^{-3}$. On the other hand, the LDD regions in the pixel TFT are provided for the principal purpose of decreasing the off-current value, in which the concentration of the impurity element can be the same as that in the LDD regions in the N-channel TFT of the drive circuit, although it can also be ½ to ¹⁄₁₀ of that concentration. In FIG. 3, although the pixel TFT 169 is completed as a double-gate structure, it can also be a single-gate structure, or a multi-gate structure provided with a plurality of gate electrodes.

As explained above, according to the present invention, the structure of the TFT constituting each circuit has been optimized in accordance with the specifications demanded by the pixel TFT and the driver circuit, with the result that the operating efficiency and reliability of a semiconductor device can be improved.

Embodiment 2

Figure 4:
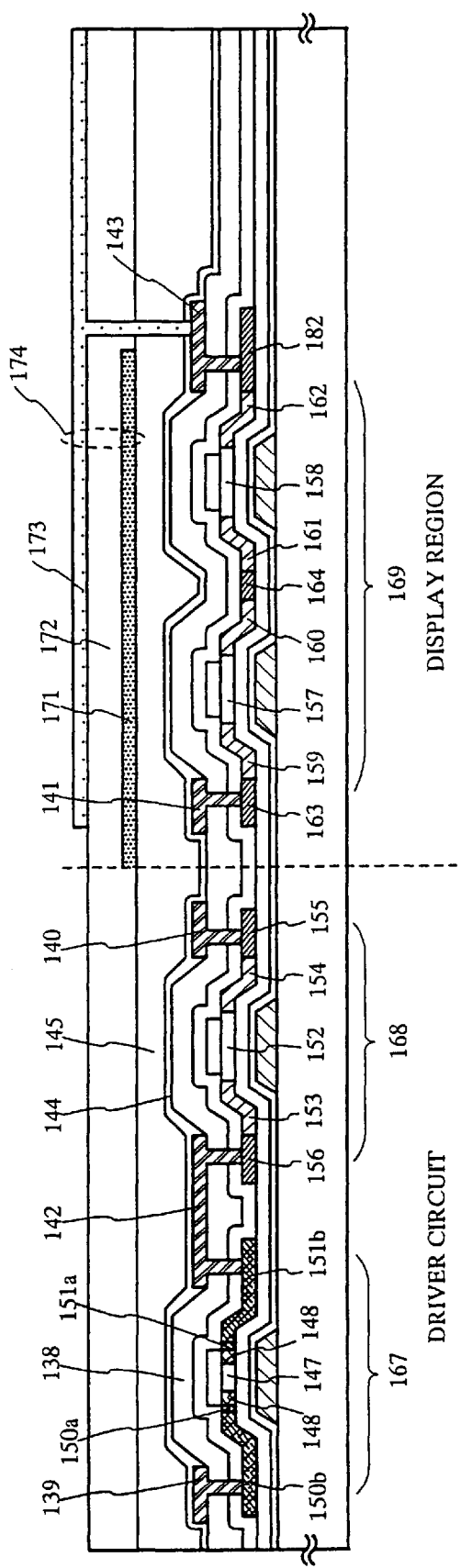
FIG. 4 is a diagram illustrating a manufacturing process of a pixel TFT and a TFT of a drive circuit of Embodiment 2.

Referring to FIG. 4, Embodiment 2 is explained by way of example in which a storage capacitor connected to the pixel TFT is provided, as is different from Embodiment 1. The P-channel TFT 167 and the N-channel TFT 168 of the drive circuit and the pixel TFT 169 are manufactured in the same way as in Embodiment 1. The point of difference from Embodiment 1 will be explained hereinbelow.

At least on the tope of the pixel TFT, a light shielding film 171 is formed on the second interlayer insulating film 145.

The light shielding film 171 is a film formed of one or a plurality of elements selected from Al, Ti, and Ta or has one of these elements as main components with a thickness of 100 to 300 nm, and is patterned into a predetermined shape. Similar to the second interlayer insulating film, a third interlayer insulating film 172 is formed at a thickness of 0.5 to 1 µm on the light shielding film 171 using an organic resin film. A contact hole that reaches the drain wiring 143 is formed in the third interlayer insulating film 172, the second interlayer insulating film 145, and the passivation film 144, on to which a pixel electrode 173 is then provided. If the pixel electrode 173 is used in transmission type liquid crystal display devices, a transparent conductive film can be used. On the other hand, if it is used in reflection type liquid crystal display devices, a metallic film can be used. Here, since the pixel electrode is used in a transmission type liquid crystal device, an indium tin oxide (ITO) film is formed at a thickness of 100 nm by sputtering. In this way, the storage capacitor 174 connected to the pixel TFT 169 can be formed from the light shielding film 171, the third interlayer insulating film 172, and the pixel electrode 173.

Embodiment 3

Figure 5A:
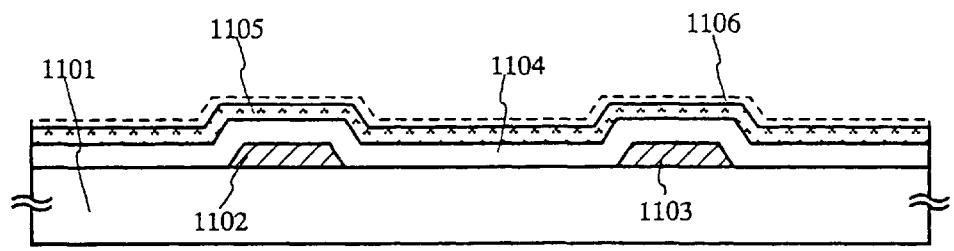
FIGS. 5A–5C are diagrams illustrating a manufacturing process of a crystalline semiconductor film of Embodiment 3.
Figure 5B:
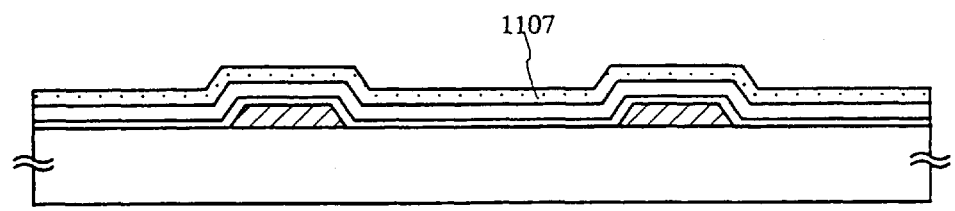
Figure 5C:
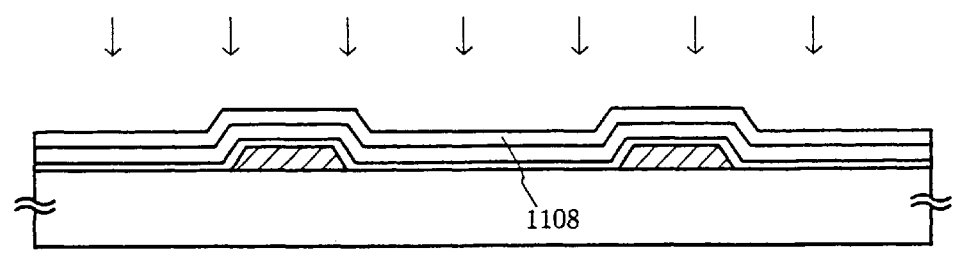

A process of forming a crystalline semiconductor film that becomes an active layer of the TFT indicated in embodiments 1 and 2 will be explained in this embodiment with reference to FIGS. 5A–5C. First, gate electrodes 1102 and 1103 are formed at a thickness of 100 to 400 nm on a substrate 1101 (a glass substrate in this embodiment). Each of the gate electrodes is formed of a material containing one or a plurality of elements selected from Al, Ti, Ta, Mo, and W, and is patterned and formed so that the end surface will be taper-like. Although not shown, the gate electrode can also be a laminated structure formed of the above material (s). For instance, it can be a 2-layered structure of tantalum nitride (TaN) and Ta from the substrate side. Further, an oxide can be coated and formed by anodic oxidation and the like on the surface of the gate electrode. A gate insulating film 1104 is formed of a silicon nitride film, a silicon oxide film, or a silicon oxide nitride film at a thickness of 20 to 200 nm, preferably 75 to 125 nm. Then, on the gate insulating film 1104, a 50 nm thickness of amorphous semiconductor film 1105 (an amorphous silicon film in this embodiment) is formed continuously without being released into the atmosphere.

Thereafter, a water solution containing 10 ppm of catalytic element (nickel in this embodiment) in terms of a weight is coated by a spin coating method to form a catalytic element-contained layer 1106 on the entire surface of the amorphous semiconductor film 1105. The catalytic elements that are usable in this embodiment include germanium (Ge), iron (Fe), palladium (Pd), tin (Sn), lead (Pb), cobalt (Co), platinum (Pt), copper (Cu), and gold (Au) other than nickel (Ni). According to this embodiment, nickel is added by the spin coating method. Other than the above, means for forming a thin film made of a catalytic element (a nickel film in this embodiment) on the amorphous semiconductor film by a vapor method or sputtering can also be employed. (FIG. 5A)

Before crystallization, heat treatment is performed at 400 to 500° C. for about 1 hour. After eliminating hydrogen from the inside of the film, heat treatment is performed at 500 to 650° C. (preferably at 550 to 570° C.) for 4 to 12 hours (preferably for 4 to 6 hours). In this embodiment, heat treatment is performed at 550° C. for 4 hours and a crystalline semiconductor film 1107 (a crystalline silicon film in this embodiment) is formed. (FIG. 5B)

Regarding the active layer 1107 formed in the above manner, by using a catalytic element (here it is nickel) to promote crystallization, a crystalline semiconductor film having excellent crystal qualities can be formed. Moreover, to enhance the crystal qualities, an laser crystallization method can be used together. For instance, an XeF excimer laser light (a wavelength of 308 nm) is used to irradiate the crystalline semiconductor film 1107 fabricated in FIG. 5B with a linear beam at an oscillation frequency of 5 to 50 Hz and at an energy density of 100 to 500 mJ/cm$^2$ so as to set the overlap ratio of the linear beam at 80 to 98%. As a result, a crystalline semiconductor film 1108 with further excellent crystal qualities can be formed. (FIG. 5C)

By utilizing the crystalline semiconductor film fabricated in this way on the substrate 1101, a TFT with good characteristics can be obtained when manufactured by the procedures indicated in embodiments 1 and 2. The characteristics of a TFT can be typically expressed by the electric field effect mobility. Therefore the characteristics of a TFT formed of the crystalline semiconductor film fabricated by the present invention can be obtained in which the electric field effect mobility in the N-channel TFT and the P-channel TFT are 150 to 220 cm$^2$/V-sec and 90 to 120 cm$^2$/V-sec, respectively. Besides, little characteristic deterioration can be observed even if the TFT is operated continuously and excellent characteristics can also be achieved in view of a reliability perspective.

Embodiment 4

In this embodiment, another structure in which a storage capacitor connected to the pixel TFT will be explained with reference to FIGS. 6A to 7B. Here, the processes of forming the storage capacitor shown in FIGS. 6A to 7B are similar with those explained in Embodiment 1. That is, the processes up to the formation of the second interlayer insulating film 145 made of an organic resin film in this embodiment are the same as those in Embodiment 1, and these processes have been described with reference FIGS. 1A to 3. Hence, the explanation in this embodiment will be given focusing on the point of difference with Embodiment 1.

Figure 6A:
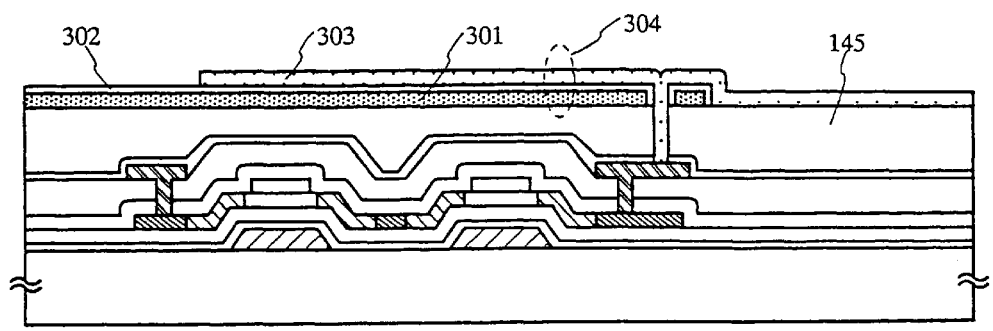
FIGS. 6A–6C are diagrams showing an example of a sectional structure of a storage capacitor of Embodiment 4.

In FIG. 6A, firstly, the second interlayer insulating film 145 is formed by following the process of Embodiment 1, and then a light shielding film 301 is formed of a material containing an element selected from Al, Ta, and Ti. Next, a dielectric film 302 (formed of an oxide from a material which forms the light shielding film) is formed at a thickness of 30 to 150 nm (preferably 50 to 75 nm) on the surface of the light shielding film 301 by anodic oxidation.

When forming the dielectric film 302 by anodic oxidation, first, a tartaric acid ethylene glycol solution of a sufficiently small alkali ion concentration is prepared. This solution is a mixture of 15% of tartaric acid ammonium water solution and ethylene glycol in the proportion of 2:8. Ammonia water is added to this solution and then adjustments are made so that the pH will become 7±0.5. Then, a platinum electrode that becomes a cathode is placed in this solution. The substrate on which the light shielding film 301 is formed is immersed in the solution, and then using the light shielding film 301 as an anode, a direct current is applied thereto at a constant level (several mA to several tens mA). The voltage between the anode and the cathode in the solution is time-varying along with the growth of the oxide, but the voltage is adjusted so that the current may be constant. When the voltage reaches 150 V, the oxidation process is completed without having to maintain the voltage or with the retention time in a range of several seconds to several tens seconds.

In doing this, the dielectric film can be formed without wrapping of the surface where the light shielding film 301 comes in contact with the second interlayer insulating film.

In the present embodiment, a dielectric film is formed only on the surface of the light shielding film, but a vapor phase method such as plasma CVD, thermal CVD, or sputtering can be employed to form the dielectric film. In that case preferably the film thickness is also 30 to 150 nm (preferably 50 to 75 nm). Also, a silicon oxide film, a silicon nitride film, a silicon oxide nitride film, a DLC (diamond like carbon) film, or an organic resin film, or a lamination film combining these can be used as the dielectric film.

A pixel electrode 303 is thereafter formed in the same way as that of embodiment 1. In this way, a storage capacitor 304 can be formed on the region in which the light shielding film 301 overlaps the pixel electrode 303 via the dielectric film 302.

Figure 6B:
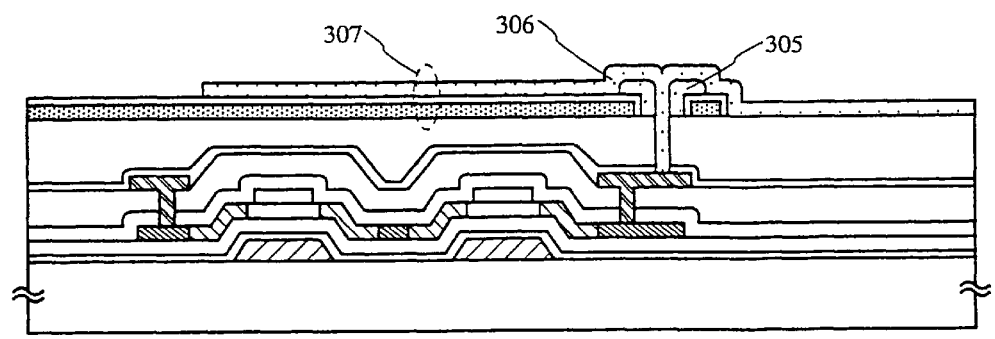

In the structure of FIG. 6B, after forming the light shielding film 301 and the dielectric film 302 in the same way as that of FIG. 6A, a spacer 305 made of organic resin is formed. A film made of a material selected from polyimide, polyamide, polyimide-amide, acrylic, BCB (benzocyclobutene) can be used as an inorganic resin film. Next, the spacer 305, the second interlayer insulating film 145, and the passivation film 143 are etched to form a contact hole, and a pixel electrode 306 is formed of the same material as that of embodiment 1. In this way, a storage capacitor 307 can be formed on the region in which the light shielding film 301 overlaps the pixel electrode 306 via the dielectric film 302. Providing the spacer 305 can prevent the short circuit that may be generated between the light shielding film 301 and the pixel electrode 306.

Figure 6C:
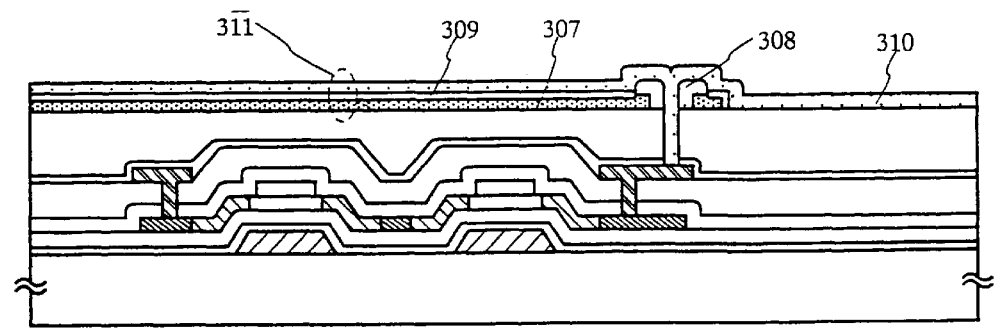

In the structure of FIG. 6C, the light shielding film 301 is formed in the same way as that of FIG. 6A and a spacer 308 made of organic resin is formed so as covering the end portion of the light shielding film 301. A film mad of a material selected from polyimide, polyamide, polyimide-amide, acrylic, BCB (benzocyclobutene) can be used as an inorganic resin film. Next, a dielectric film 309 is formed on the surface of the light shielding film 301 that is exposed by anodic oxidation. No dielectric film is formed in the portion that comes in contact with the spacer 308. Next, the spacer 308, the second interlayer insulating film 145, and the passivation film 143 are etched to form a contact hole, and a pixel electrode 310 is formed of the same material as that of embodiment 1. In this way, a storage capacitor 311 can be formed on the region in which the light shielding film 301 overlaps the pixel electrode 310 via the dielectric film 309. Providing the spacer 308 can prevent short circuit that may be generated between the light shielding film 301 and the pixel electrode 310.

Figure 7A:
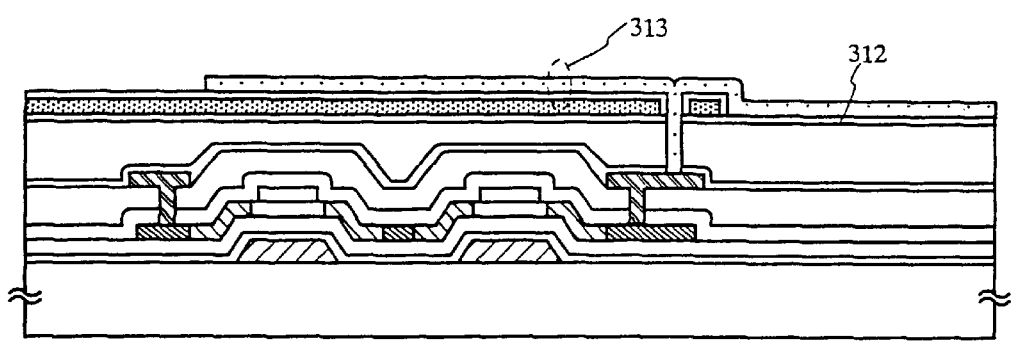
FIGS. 7A–7B are diagrams showing an example of a sectional structure of a storage capacitor of Embodiment 4.

In FIG. 7A, the second interlayer insulating film 145 is formed first by following the process in Embodiment 1 and then an insulating film 312 formed of materials such as a silicon oxide film, a silicon nitride film, or a silicon oxide nitride film is formed thereon. A known film formation method is used to form the insulating film 312, although it is better to use sputtering in particular. Hereinafter, the light shielding film, the dielectric film, and the pixel electrode are formed in the same way as that in FIG. 6A and then a storage capacitor 313 is provided. Providing the insulating film 312 improves adhesion with the underlayer of the light shielding film and the dielectric film can be prevented from wrapping the interface with the underlayer of the light shielding film when the dielectric film is formed by anodic oxidation.

Figure 7B:
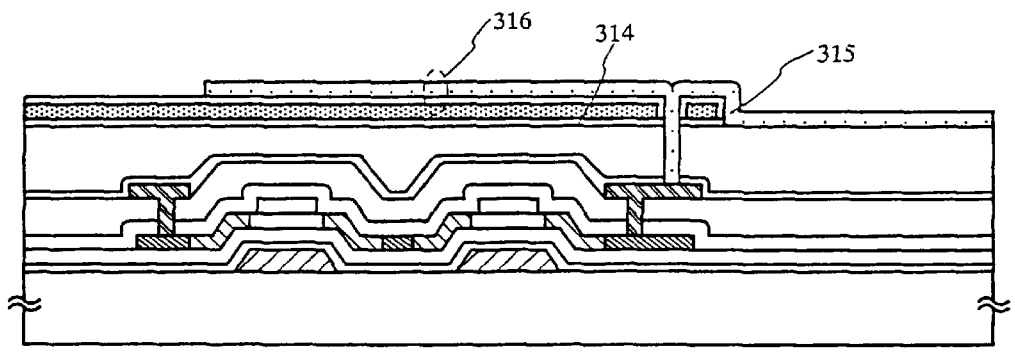

In FIG. 7B, after forming the insulating film and the light shielding film in the same way, the region that is not close to the light shielding film of the insulating film is removed by etching to form an insulating film 314 so that it overlaps under the light shielding film. Next, a pixel electrode 315 is provided. With this structure, the adhesion of the light shielding film with the underlayer thereof can be improved and the dielectric film can be prevented from wrapping the interface with the underlayer of the light shielding film can be prevented when the dielectric film is formed by anodic oxidation. Furthermore, the transmission rate of the light through the pixel region in which the light shielding film is formed can be improved.

It is possible to combine the structures shown in FIGS. 7A and 7B with the structures shown in FIGS. 6B and 6C in which a spacer is provided. It is further possible to combine the structures according to the present embodiment shown in FIGS. 6A to 7B with the structures according to embodiment 1 and embodiment 2.

Embodiment 5

In a method of manufacturing a semiconductor device provided with a pixel TFT in a display region shown in Embodiments 1 and 2 and a TFT of a drive circuit formed in the periphery of the display region on the same substrate, a crystalline semiconductor film as an active layer, insulating films such as a gate insulating film, an interlayer insulating film, and an underlying film, and conductive films such as a gate electrode, a source wiring, a drain wiring, and a pixel electrode can all be manufactured by sputtering. The advantage of employing the sputtering method is that when forming a conductive film, the DC (direct current) discharge method can be adopted. Hence, it is applicable for forming a uniform film on a large-area substrate. Further, it is not necessary to use a silane ($SiH_4$) which needs to be handled with great caution when forming films made of silicon-based materials such as an amorphous silicon film and a silicon nitride film. Thus, safety of operation can be secured. This matter can be utilized as a great merit especially for a production site. Hereinafter, a manufacturing process employing the sputtering method will be explained following the processes of Embodiment 1.

The gate electrodes 102 through 104 and the capacitor wiring 105 in FIG. 1A can be easily formed by the known sputtering method using target materials such as Ta, Ti, W, and Mo. When using compound materials such as W-Mo and Ta-Mo, similarly, it is appropriate to use compounds of target materials. Further, in case of forming TaN and WN, the above can be manufactured by appropriately adding elements such as nitrogen ($N_2$) and ammonia ($NH_3$) other than argon (Ar) in a sputtering atmosphere. Also, in addition to argon (Ar), there is a method of controlling the internal stress of a film that is to be manufactured by adding helium (He), krypton (Kr), and xenon (Xe) to the gas for sputtering.

The silicon nitride film 106a used in the gate insulating film 106 can be formed by using silicon (Si) target and appropriately mixing Ar, $N_2$, hydrogen ($H_2$), and $NH_3$, or even by using a target material of silicon nitride, the silicon nitride film can be formed in the same way. Using Si target and appropriately mixing Ar, $N_2$, $H_2$, and $N_2O$, the silicon oxide nitride film 106b can be manufactured by sputtering.

In the same way, Si target is used so that the amorphous silicon film can be manufactured by utilizing Ar and $H_2$ in sputter gas. Further, if a very small amount of boron (B) is added into the amorphous silicon film, several tens ppm to several thousands ppm of boron (B) can be added into the target in advance or diborane ($B_2H_6$) can be doped into the sputter gas.

A silicon oxide film that is applicable for the channel protection films 119 through 122 can be manufactured by using silicon oxide (or quartz) as the target material and then sputtering Ar or mixed gas of Ar and oxygen ($O_2$). A silicon nitride film, a silicon oxide film, or a silicon oxide nitride film used for forming the protection insulating film 137, the interlayer insulating film 138, the passivation film 144 can be manufactured in the same way as mentioned above.

If Al is used for the source wirings 139 through 141 and the drain wirings 142 and 143, then about 0.01 to 5 wt % elements such as Ti, Si, scandium (Sc), vanadium (V), or Cu is contained so that hillock can be effectively prevented. Ti, Ta, Al, and the like used for the light shielding film 171 and ITO, ZnO, $SnO_2$, and the like used for the pixel electrode 146 can all be formed by the known sputtering method.

In this way, other than the second interlayer insulating film 145 and the third interlayer insulating film 172 made of organic resin, any film can be formed by sputtering. Moreover, detailed experiment conditions can be appropriately determined by a user.

Embodiment 6

Figure 12A:
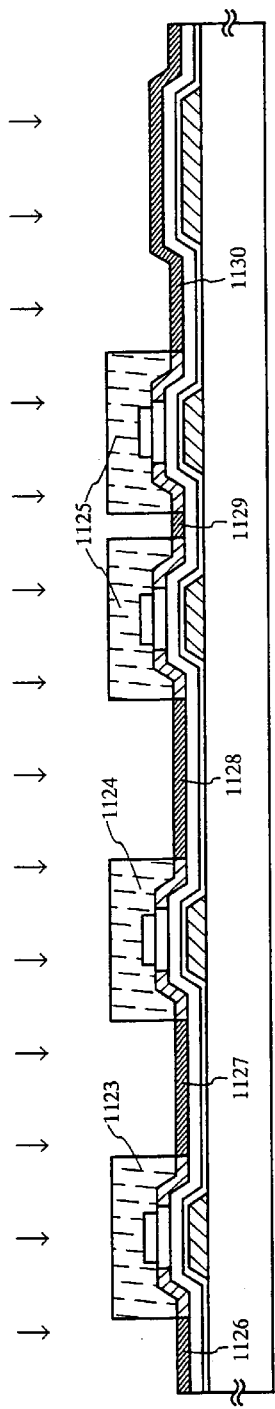
FIGS. 12A–12C are diagrams illustrating a manufacturing process of a pixel TFT and a TFT of a drive circuit of Embodiment 6.

Another example of the pixel TFT and the TFT of the drive circuit, particularly the P-channel TFT is indicated in this embodiment. First of all, perform the processes of from FIG. 1A to FIG. 2A in the same way as explained in Embodiment 1. The drawing of FIG. 12A corresponds to FIG. 2A. It illustrates a state in which resist masks 1123 through 1125 and impurity regions 1126 through 1130, doped with an impurity element that gives n-type, are formed.

Figure 12B:
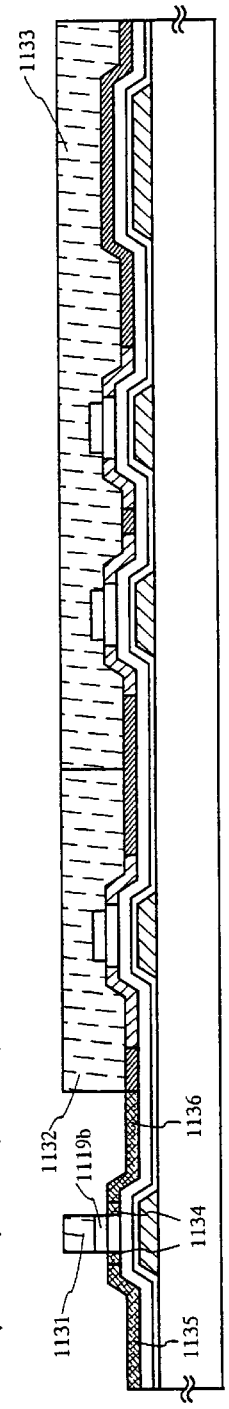
Figure 12C:
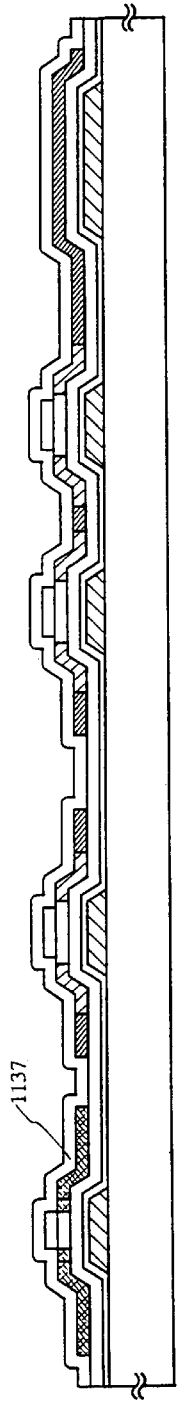

The forming of the $p^+$ region is then carried out as shown in FIG. 12B. A mask 1131 is formed on a channel protection insulating film 1119 so as to be positioned on the inside, and a region in which the N-channel TFT is formed is entirely covered by resist masks 1132 and 1133. Furthermore, a channel protection film 1119b having a new shape is formed by performing etching, that is, wet etching is carried out on the channel protection film 1119 using fluorine-based solution so that the end portion of the film 1119 almost coincides with the end portion of the mask 1131. Thereafter, high concentration impurity regions 1134 through 1136 are formed by ion doping (ion implantation can be used) using diborane ($B_2H_6$). An impurity element is added into the impurity regions 1134 through 1136 from the surface of the crystalline silicon film. The range of boron concentration in this region is $1.5 \times 10^{20}$ to $3 \times 10^{21}$ $cm^{-3}$, here it is $2 \times 10^{21}$ $cm^{-3}$. In this specification, the concentration of the impurity element that gives p-type included in the impurity regions 1134 through 1136 formed here is expressed as "$p^+$". In this way, by providing the end portion of the high concentration impurity regions in the P-channel TFT that comes in contact with the channel forming region more to the side of the channel forming region than to the end portion of the low concentration impurity regions 1113 and 1114 formed in the previous process, the junction condition in this portion can be made into a good one.

As shown in FIGS. 1B to 2A, the impurity regions 1135 and 1136 are added with phosphorus (P) in the previous process, therefore a region containing a mixture of boron (B) and phosphorus (P) is formed. However, in this process, by adding boron (B) at a concentration of 1.5 to 3 times higher than that of the previous process, p-type conductivity can be secured and no influences are inflicted upon the characteristics of the TFT. In this specification, this region is referred to as impurity region "B". Also, the impurity region 1134 at the side of the channel forming region is a region containing boron (B) only, and this region is referred to as region "A" in this specification.

Respective impurity elements are selectively added into the crystalline silicon film and then etching is carried out on this crystalline silicon film so that it is divided into island-like films. Then a protection insulating film 1137, which will later become a portion of the first interlayer insulating film, is formed. The protection insulating film 1137 can be formed of a silicon nitride film, a silicon oxide film, a silicon oxide nitride film, or a lamination film of the combination thereof and may be at a thickness of 100 to 400 nm.

Thereafter, the heat treatment process is carried out for the purpose of activating the impurity elements giving either an n-type or p-type that have been added at respective concentrations. When activation is carried out by furnace annealing, heat treatment is performed at 300 to 650° C., preferably 500 to 550° C. in a nitrogenic atmosphere. In this process, heat treatment was performed at 525° C. for 4 hours. When laser annealing is applied, irradiation is conducted by using the excimer laser as a light source, forming the laser light into a linear beam having a width of 100 to 500 í m by an optical system and irradiating the linear beam at the oscillation frequency of from 10 to 100 Hz; the oscillation pulse width of from 20 to 50 nsec (preferably 30 nsec), and the energy density of from 100 to 500 $mJ/cm^2$. Another heat treatment is performed at 300 to 450° C. for 1 to 12 hours in an atmosphere containing 3 to 100% of hydrogen to hydrogenate the active layer. This process is to terminate the dangling bonds in the active layer by thermally excited hydrogen. As other hydrogenation means, plasma hydrogenation (using hydrogen excited by plasma) can be performed.

After completing the activation process, an interlayer insulating film 1138 is formed at a thickness of 500 to 1500 nm on the protection insulating film 1137. A lamination film formed of the above insulating film 1137 and the interlayer insulating film 1138 functions as a first interlayer insulating film. A contact hole that reaches the source region or drain region of the respective TFTs is next formed, and then source wirings 1139 through 1141 and drain wirings 1142 and 1143 are formed. Though not shown, this electrode according to the present embodiment is a laminated film of a three-layered structure consisting of a 100 nm Ti film, a 300 nm aluminum film containing Ti, and a 150 nm Ti film which are formed by sputtering in successions.

The protection insulating film 1137 and the interlayer insulating film 1138 can be formed of a silicon nitride film, a silicon oxide film or a silicon oxide nitride film, or the like. In any case, it is better that the internal stress of the film be made into the compression stress.

Next, using a silicon nitride film, a silicon oxide film, or a silicon oxide nitride film, a passivation film 1144 is formed at a thickness of 50 to 500 nm (typically 100 to 300 nm). If hydrogenation process is carried out in this state, desirable effects can be achieved with respect to improving the characteristics of TFTs. For instance, it is better if heat treatment is performed at 300 to 450° C. in an atmosphere containing 3 to 100% of hydrogen for 1 to 12 hours or by employing a plasma hydrogenation method in which similar effects can be obtained. Moreover, an opening may be formed in the passivation film 1144 at a position where a contact hole for connecting a pixel electrode to the drain wiring is to be formed.

Thereafter, a second interlayer insulating film 1145 formed of organic resin is formed at about 1 í m of thickness in the same way as that of Embodiment 1. Then, a contact hole that reaches the drain wiring 1143 is formed in the second interlayer insulating film 1145 and the passivation film 1144, thus, a pixel electrode 1146 is provided. If a transmission type liquid crystal display device is to be manufactured, a transparent insulating film is used to form the pixel electrode 1146. On the other hand, if it is a reflector type liquid crystal display device that is to be manufactured, a metallic film is used. Aimed here is a transmission type liquid crystal device, and therefore an indium tin oxide (ITO) film is formed at a thickness of 100 nm by sputtering. A pixel electrode 1190 is the electrode of a neighboring pixel. From the above processes, the pixel TFT of a display portion and the TFT of the drive circuit in the periphery of the display portion are formed on the same substrate. In the drive circuit, an N-channel TFT 1168 and a P-channel TFT 1167 are formed, and a logic circuit structured with a CMOS circuit as the basic circuit can be formed. A pixel TFT 1169 is an N-channel TFT, and furthermore, a storage capacitor is formed from the capacitor wiring 105, a semiconductor layer 1166, and an insulating film formed therebetween, and is connected to this pixel TFT 1169 (FIG. 3).

A P-channel TFT 1167 of the drive circuit has a channel forming region 1147, source regions 1148 and 1150 and drain regions 1149 and 1151, which are formed in high concentration impurity regions. The source region 1150 and the drain region 1151 are formed in the impurity region "B". The concentration of boron (B) in the regions is adjusted to have a concentration 1.5 to 3 times higher than the concentration of phosphorous (P). On the inside of the impurity region "B", that is, the source region 1148 and the drain region 1149 formed on the side of the channel forming region 1147 is the impurity region "A". This impurity region "A" is a region containing only boron in the same concentration as that of the impurity region "B". The structure here is that the entire region "A" overlaps the gate electrode 1102 while on the other hand a portion of the region "B" overlaps the gate electrode 1102. In this way, by forming the high concentration impurity region in the P-channel TFT from the region "A" and the region "B" from and by forming the region "B" far away from the channel forming region, the junction of the channel forming region and the high concentration impurity region can be a good one.

Figure 13:
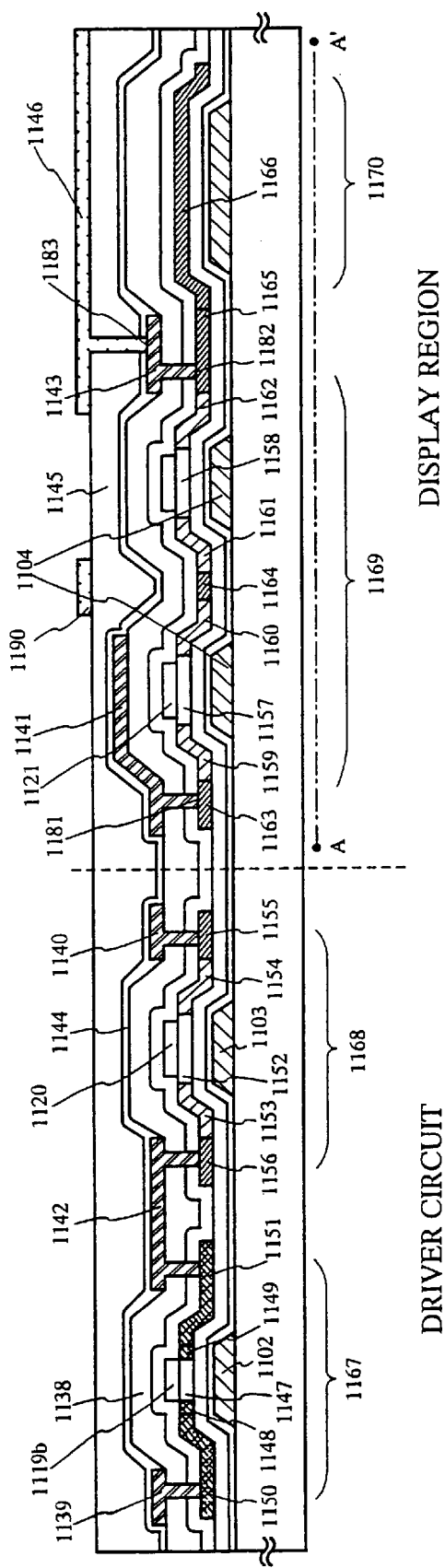
FIG. 13 is a diagram illustrating a manufacturing process of a pixel TFT and a TFT of a drive circuit of Embodiment 6.

An N-channel TFT 1168 of the drive circuit has a channel forming region 1152, a source region 1155 and a drain region 1156, and LDD regions 1153 and 1154. The pixel TFT 1169 has channel forming regions 1157 and 1158, source regions or drain regions 1163 through 1165, and LDD regions 1159 through 1162. The LDD regions in the N-channel TFT of the drive circuit are provided with the principal purpose of preventing the deterioration of the on-current value due to hot carrier implantation by relaxing high electric field in the vicinity of the drain. Thus, it is appropriate to make the concentration of a suitable impurity element that gives n-type at $5\times10^{17}$ to $5\times10^{18}$ cm$^{-3}$. On the other hand, the principal purpose of providing the LDD regions in the pixel TFT is to decrease the off-current value. The concentration of an impurity element in these regions may be the same as those in the LDD regions in the N-channel TFT in the drive circuit, or may be ½ to ⅒ of that concentration. In FIG. 13, although the pixel TFT 1169 is completed as a double-gate structure, it can also be a single-gate structure, or a multi-gate structure provided with a plurality of gate electrodes without causing any problem.

In a TFT manufactured by the above process, the channel protection insulating film 1119b and channel protection insulating films 1120 through 1122 can be formed without receiving any damages from ion doping or the like. Therefore, the characteristics of the TFT are stable. For instance, when a voltage of −1.7 MV is applied to the gate electrode and then leaving it for an hour at 150° C. as a bias thermal stress (BTS) test, hardly any fluctuations can be observed in the threshold voltage, the field effect mobility, the sub-threshold constant, the on-current value, etc. Furthermore, according to the present invention, the operation performance and the reliability of a semiconductor device can be improved by optimizing the structures of the TFTs that compose the pixel TFT circuit and the driver circuit in accordance with the specifications of the respective circuits demand.

Also, regarding the structure of the storage capacitor shown in FIG. 13, it can be formed from the light shielding film, the dielectric film formed on the surface of the light shielding film by anodic oxidation, and the pixel electrode according to embodiment 4 explained with reference to FIGS. 6A to 7B.

Embodiment 7

Figure 8:
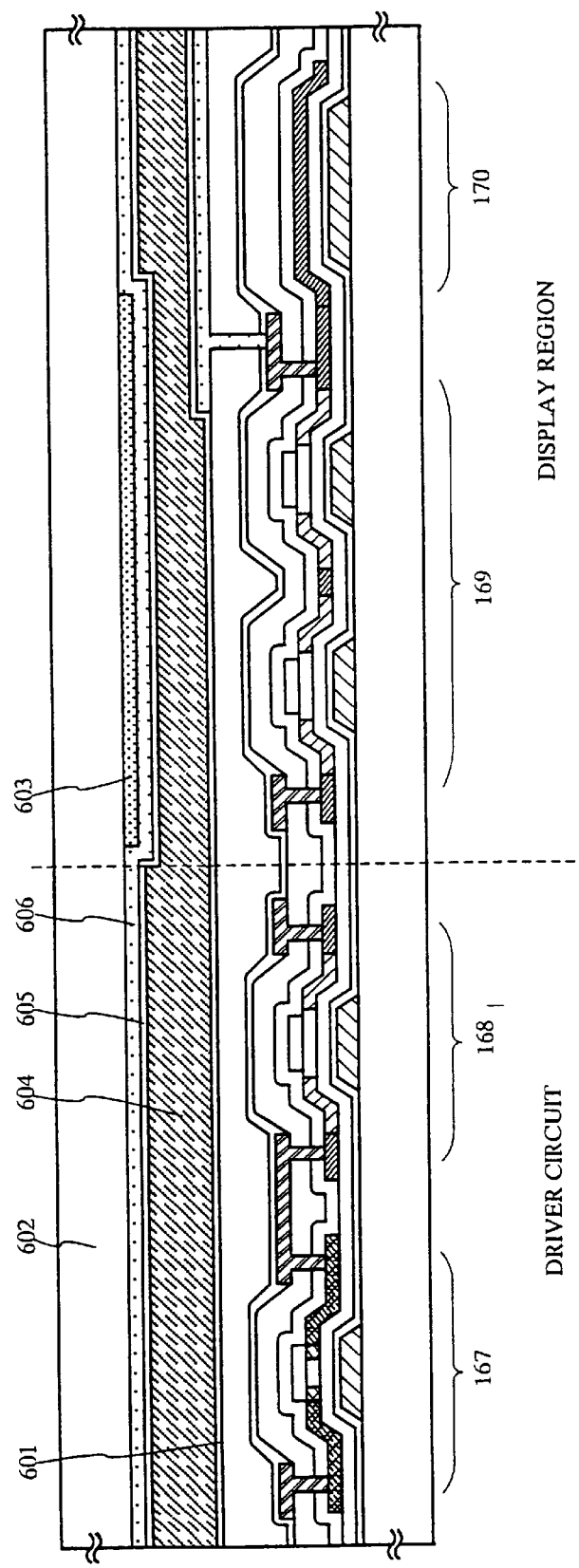
FIG. 8 is a diagram showing a sectional structure of an active matrix liquid crystal display device of Embodiment 7.

In this embodiment, processes of manufacturing an active matrix liquid crystal display device from a substrate in which a pixel TFT and a drive circuit are formed are described hereon. As shown in FIG. 8, an orientation film 601 is formed on a substrate in the state shown in FIG. 3 manufactured according to embodiment 1. Normally, polyimide resin is often used as an orientation film in a liquid crystal display device. A light shielding film 603, a transparent conductive film 604, and an orientation film 605 are formed on an opposite substrate 602. After forming the orientation film, a rubbing operation is performed so that the crystal molecules are orientated at a fixed pre-tilt angle. Then using a well-known cell assembling process, the opposite substrate and the other substrate on which the pixel TFT and the drive circuit are formed are stuck together with sealing materials or a spacer (both not shown). Then after injecting a liquid crystal material 606 between the two substrates, the liquid crystal material is completely sealed by a sealing agent (not shown). It is appropriate to use well-known liquid crystal material as the liquid crystal material. The active matrix liquid crystal display device shown in FIG. 8 is completed in this way.

Next, a structure of the active matrix liquid crystal display device will be described with reference to the perspective view of FIG. 9 and to the top view of FIG. 10. It should be noted that the same reference numerals as that of FIGS. 1A to 3 and FIG. 8 are used in FIGS. 9 and 10 in order to correlate the latter with the sectional structural views of the former. Further, the sectional structure along the line A–A' indicated in FIG. 10 corresponds to the cross-sectional view of the pixel TFT 169 and the storage capacitor 170 shown in FIG. 3.

Figure 9:
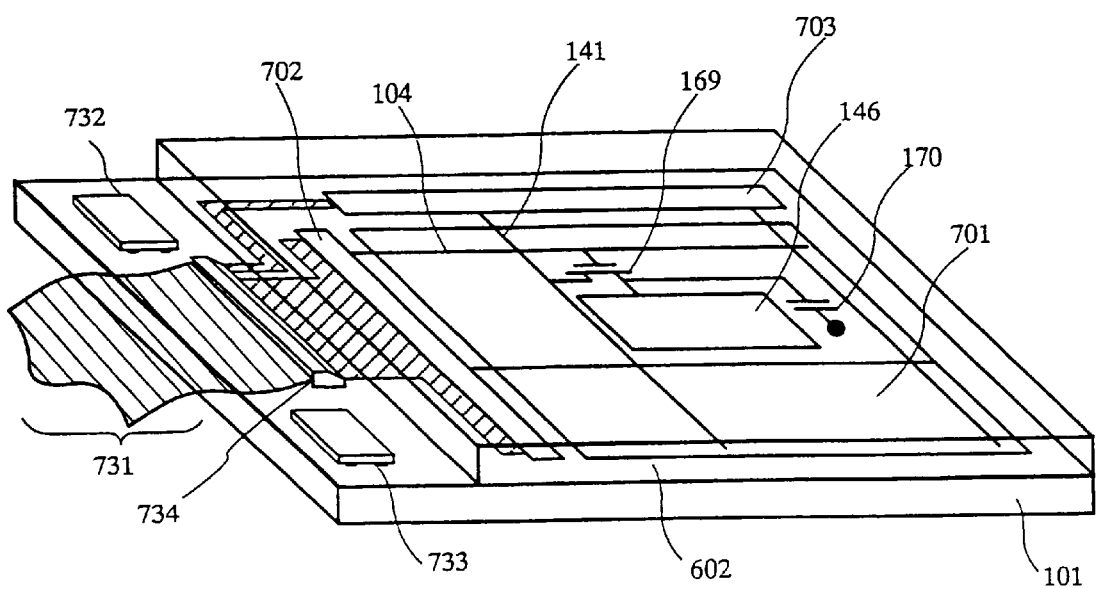
FIG. 9 is a perspective view schematically showing an active matrix liquid crystal display device of Embodiment 7.

In the perspective view shown in FIG. 9, the structure of the active matrix liquid crystal display comprises a display region 701, a scanning (gate) line drive circuit 702, and a signal (source) line drive circuit 703, which are formed on the glass substrate 101. The pixel TFT 169 is formed in the display region and the drive circuit formed in the periphery of the display region is structured with a CMOS circuit as the basic circuit. The scanning (gate) line drive circuit 702 and the signal (source) line drive circuit 703 are connected to the pixel TFT in the display region 701 by the gate wiring 104 (denoted by the same reference numeral as the gate electrode, for the wiring 104 is formed by extending the gate electrode and is connected thereto) and the source wiring 141, respectively. An FPC731 is connected to an external input/output terminal 734.

Figure 10:
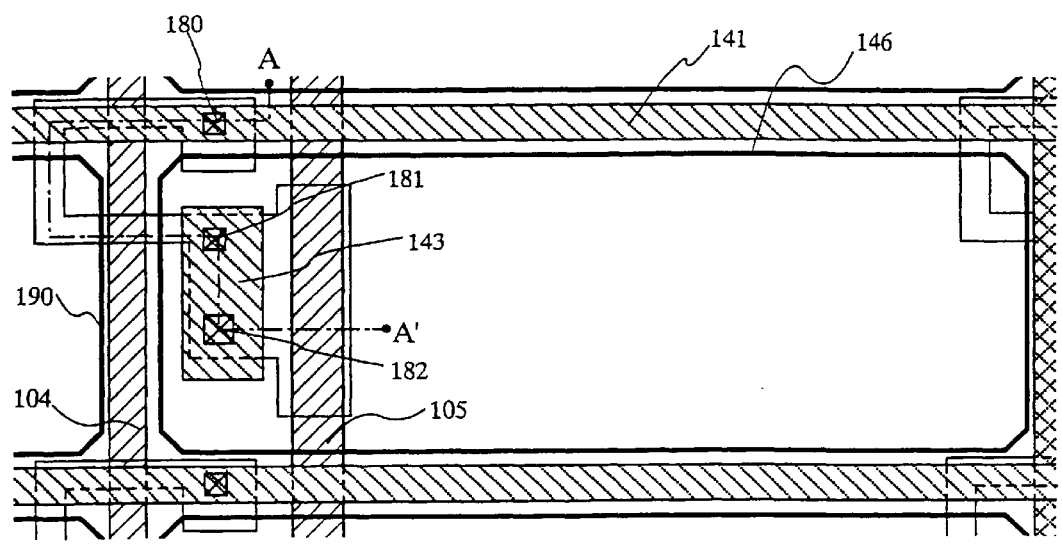
FIG. 10 is a diagram of the top surface of a pixel of Embodiment 7.

FIG. 10 is a top view of almost an entire pixel of the display region 701. The gate wiring 104 intersects with an active layer under a not shown gate insulating film via this gate insulating film. And also not shown, the active layer is formed of a source region, a drain region, and an LDD region formed of the n⁻ region. Further, reference numeral 180 denotes a contact portion of the source wiring 141 and the source region 163, 181 denotes a contact portion of the drain wiring 143 and the drain region 165, and 182, a contact portion of the drain wiring 143 and the pixel electrode 146. The storage capacitor 170 is formed of a semiconductor layer 166 that comes in contact with the drain region 165 of the pixel TFT 169, the capacitor wiring 105, and a region which is formed therebetween and overlaps with the insulating film.

The active matrix liquid crystal display device is explained applying the structure in Embodiment 1, it is also possible to fabricate an active matrix liquid crystal display device freely combined with any of Embodiments 1 to 6.

Embodiment 8

The substrate manufactured by carrying out the present invention and having a pixel TFT and a drive circuit which are formed on the same substrate may be used in various electro-optical display devices (active matrix liquid crystal display devices, active matrix EL display devices, and active matrix EC display devices). In other words, the present invention may be embodied in all kinds of electronic equipment having as display medium those electro-optical display devices incorporated therein.

As such electronic equipment, there are enumerated: video cameras; digital cameras; projectors (rear projectors or front projectors); head mount displays (goggle type displays); navigation systems for vehicles; personal computers; portable telephones; and electronic books. Specific examples thereof are shown in FIG. 11.

Figure 11A:
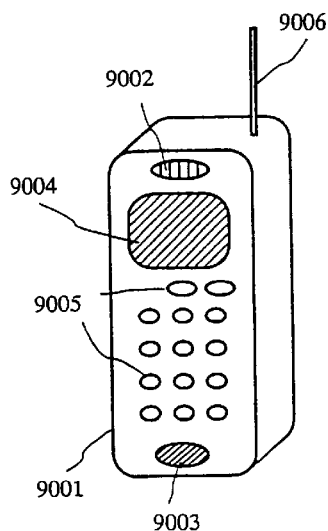
FIGS. 11A–11F are diagrams illustrating examples of a semiconductor device of Embodiment 8.

FIG. 11A shows a portable telephone that is composed of a main body 9001, a sound output section 9002, a sound input section 9003, a display device 9004, operation switches 9005, and an antenna 9006. The present invention can be applied to the sound output section 9002, the sound input section 9003, and the active matrix display device 9004 provided with a display region and a drive circuit that is formed in the periphery thereof.

Figure 11B:
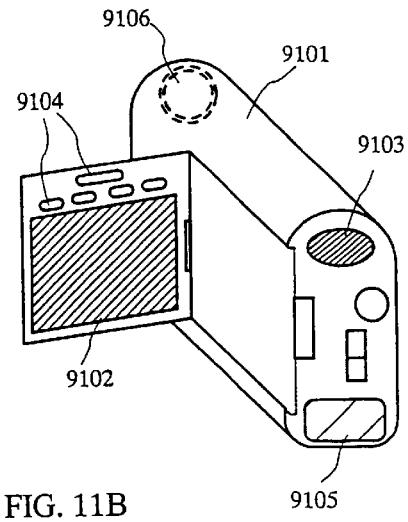

FIG. 11B shows a video camera that is composed of a main body 9101, a display device 9102, a sound input section 9103, operation switches 9104, a battery 9105, and an image receiving section 9106. The present invention can be applied to the sound input section 9103, to the active matrix display device 9102 provided with a display region and a drive circuit that is formed in the periphery thereof, and to the image receiving section 9106.

Figure 11C:
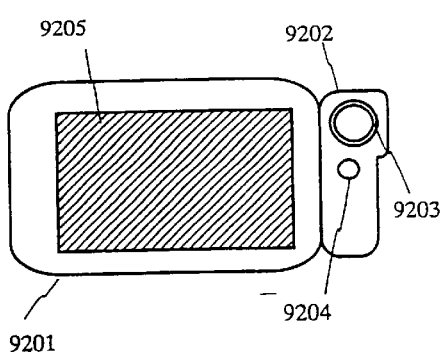

FIG. 11C shows a mobile computer that is composed of a main body 9201, a camera section 9202, an image receiving section 9203, operation switches 9204, and a display device 9205. The present invention can be applied to the image receiving section 9203, and to the active matrix display device 9205 provided with a display region and a drive circuit that is formed in the periphery thereof.

Figure 11D:
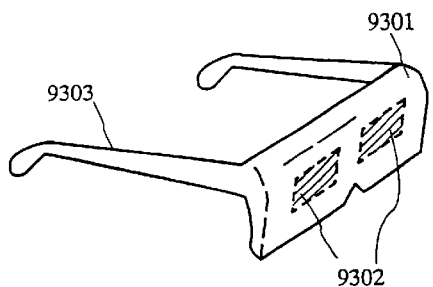

FIG. 11D shows a goggle type display that is composed of a main body 9301, display devices 9302, and arm sections 9303. The present invention can be applied to the active matrix display device 9302 provided with a display region and a drive circuit that is formed in the periphery thereof.

Though not shown, the invention is also applicable to other signal controlling circuit.

Figure 11E:
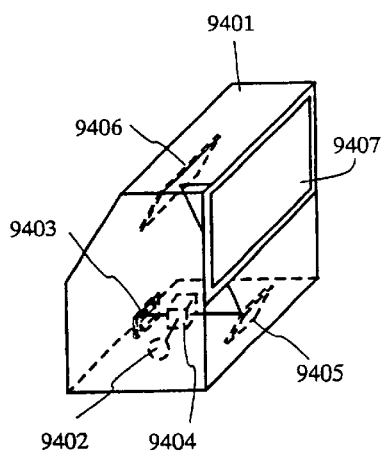

FIG. 11E shows a rear type projector that is composed of a main body 9401, a light source 9402, a 9 display device 9403, polarizing beam splitter 9404, reflectors 9405 and 9406, and a screen 9407. The present invention can be applied to the active matrix display device 9403 provided with a display region and a drive circuit that is formed in the periphery thereof.

Figure 11F:
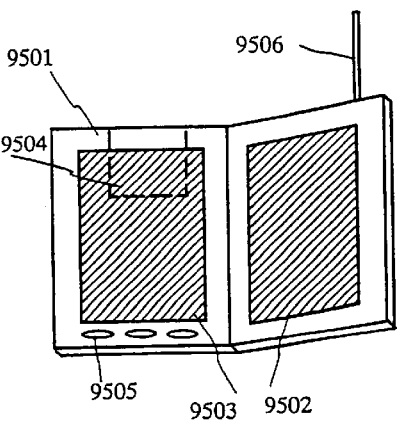

FIG. 11F shows a portable electronic book that is composed of a main body 9501, display devices 9502, 9503, a memory medium 9504, an operation switch 9505 and an antenna 9506. The book is used to display data stored in a mini-disk (MD) or a DVD, or a data received with the antenna. The display devices 9502, 9503 are direct-vision type active matrix display devices provided with a display region and a drive circuit that is formed in the periphery thereof, to which the present invention may be applied.

Other than those, though not shown, the present invention may also be applied to display sections of navigation systems for vehicles, image sensors and personal computers. The present invention thus has so wide application range that it is applicable to electronic equipment in any field. Further, the electronic equipment of this embodiment can be realized using a structure formed by combining Embodiments 1 to 7. No limitation is put on how to combine these embodiments.

By implementing the present invention, it is possible to arrange TFTs with appropriate performances that meet the specifications demanded by the functional circuits in the semiconductor device (specifically the electro-optical device in the present invention) formed of a multiple of functional circuits on the same substrate; and a substantial improvement can be made in the operation characteristics and reliability.

More particularly, a bottom-gate TFT or an inverted stagger TFT provided with the LDD regions, by forming as the LDD regions of the pixel TFT, Loff and Lov regions with n⁻ concentration, the off-current value can be substantially decreased and contributions can be made to the low power consumption of the pixel TFT. Also, by forming, as the LDD regions in the N-channel TFT in the drive circuit, Loff and Lov regions with n⁻ concentration, the electric current drive performance can be enhanced as well as preventing deterioration caused by hot carrier, and the deterioration of the on-current value can be decreased.

Furthermore, the P-channel TFT of the drive circuit has the impurity region "B" containing both an impurity element that gives p-type and an impurity element that gives n-type therein and has an impurity region "A" containing an impurity element that gives p-type therein. The impurity region "A" is formed between the impurity region "B" and the LDD region in the P-channel TFT in the drive circuit, securing the junction between the channel forming region and the LDD region that comes in contact with the channel forming region, and between the LDD region and either the source region or the drain region become. Therefore, the characteristics of the P-channel TFT can be well retained.

Moreover, the operation performance and reliability of a semiconductor device (specifically an electronic equipment in the present invention) having this type of electro-optical device as a display medium can be improved.

What is claimed is:

1. A method of manufacturing a semiconductor device, the semiconductor device having
   at least a pixel thin film transistor being formed in a display region over a substrate; and at least an n-channel thin film transistor and at least a p-channel thin film transistor in a drive circuit each being formed in a periphery of the display region over the substrate, the method comprising the steps of:

forming at least an LDD region of the pixel thin film transistor, wherein the LDD region of the pixel thin film transistor is not overlapped with a channel protection insulating film of the pixel thin film transistor, wherein at least a portion of the LDD region of the pixel thin film transistor is overlapped with a gate electrode of the pixel thin film transistor;

forming at least an LDD region of the n-channel thin film transistor in the drive circuit, wherein the LDD region of the n-channel thin film transistor in the drive circuit is not overlapped with a channel protection insulating film of the n-channel thin film transistor in the drive circuit, wherein at least a portion of the LDD region of the n-channel thin film transistor in the drive circuit is overlapped with a gate electrode of the n-channel thin film transistor in the drive circuit;

forming an LDD region of the p-channel thin film transistor in the drive circuit, wherein the LDD region of the p-channel thin film transistor in the drive circuit is overlapped with a channel protection insulating film of the p-channel thin film transistor, and wherein all of the LDD region of the p-channel thin film transistor in the drive circuit is overlapped with a gate electrode of the p-channel thin film transistor in the drive circuit.

2. A method according to claim 1, further comprising the steps of:

forming at least a first impurity region of the p-channel thin film transistor in the drive circuit, the first impurity region including both an n-type impurity and a p-type impurity; and forming at least a second impurity region of the p-channel thin film transistor in the drive circuit, the second impurity region including the p-type impurity, wherein the second impurity region is formed between the first impurity region and the LDD region of the p-channel thin film transistor in the drive circuit.

3. A method according to claim 1, further comprising a step of forming a storage capacitor being connected to the pixel thin film transistor, the step comprising:

forming a capacitor wiring over the substrate;
forming an insulating layer on the capacitor wiring;
forming a semiconductor layer on the insulating layer.

4. A method according to claim 1, further comprising a step of forming a capacitor, the step comprising:

forming an organic resin film over the pixel thin film transistor;
forming a light shielding film on the organic resin film;
forming a dielectric film being closely contacted to the light shielding film; and
forming a pixel electrode being connected to the pixel thin film transistor, a portion of the pixel electrode being overlapped with the light shielding film.

5. A method according to claim 4, wherein the light shielding film comprises at least an element selected from the group consisting of aluminum, tantalum and titanium, and wherein the dielectric film comprises an oxide of the material.

6. A method according to claim 5, wherein the dielectric film is formed through an anodic oxidation method.

7. A method according to claim 1, wherein the semiconductor device is one selected from the group consisting of a cellular phone, a video camera, a mobile computer, a goggle-type display, a projector, a mobile book, a digital camera, a car navigation device, and a personal computer.

8. A method of manufacturing a semiconductor device, the semiconductor device having at least a pixel thin film transistor being formed in a display region over a substrate; and at least an n-channel thin film transistor and at least a p-channel thin film transistor in a drive circuit each being formed in a periphery of the display region over the substrate, the method comprising the steps of:

forming at least an LDD region of the pixel thin film transistor over a gate electrode of the pixel thin film transistor, wherein the LDD region of the pixel thin film transistor is not overlapped with a channel protection insulating film of the pixel thin film transistor, wherein at least a portion of the LDD region of the pixel thin film transistor is overlapped with the gate electrode of the pixel thin film transistor;

forming at least an LDD region of the n-channel thin film transistor in the drive circuit over a gate electrode of the n-channel thin film transistor in the drive circuit, wherein the LDD region of the n-channel film transistor in the drive circuit is not overlapped with a channel protection insulating film of the n-channel thin film transistor in the drive circuit;

wherein at least a portion of the LDD region of the n-channel film transistor in the drive circuit is overlapped with the gate electrode of the n-channel thin film transistor in the drive circuit;

forming an LDD region of the p-channel thin film transistor in the drive circuit over a gate electrode of the p-channel thin film transistor in the drive circuit, wherein the LDD region of the p-channel thin film transistor in the drive circuit is overlapped with a channel protection insulating film of the p-channel thin film transistor, and wherein all of the LDD region of the p-channel thin film transistor in the drive circuit is overlapped with the gate electrode of the p-channel thin film transistor in the drive circuit.

9. A method according to claim 8, further comprising the steps of:

forming at least a first impurity region of the p-channel thin film transistor in the drive circuit, said first impurity region including both an n-type impurity and a p-type impurity; and forming at least a second impurity region of the p-channel thin film transistor in the drive circuit, the second impurity region including the p-type impurity, wherein the second impurity region is formed between the first impurity region and the LDD region of the p-channel thin film transistor in the drive circuit.

10. A method of according to claim 8, further comprising the steps of forming a storage capacitor being connected to the pixel thin film transistor, said step comprising:
   forming a capacitor wiring over the substrate;
   forming an insulating layer on the capacitor wiring;
   forming a semiconductor layer on the insulating layer.

11. A method of according to claim 8, further comprising a step of forming a capacitor,
   the step comprising:
      forming an organic resin film over the pixel thin film transistor;
      forming a light shielding film on the organic resin film;
      forming a dielectric film being closely contacted to the light shielding film; and
      forming a pixel electrode being connected to the pixel thin film transistor, a portion of the pixel electrode being overlapped with the light shielding film.

12. A method according to claim 11,
   wherein the light shielding film comprises at least an element selected from the group consisting of aluminum, tantalum and titanium, and
   wherein the dielectric film comprises an oxide of the material.

13. A method according to claim 12, wherein the dielectric film is formed through an anodic oxidation method.

14. A method according to claim 8, wherein the semiconductor device is one selected from the group consisting of a cellular phone, a video camera, a mobile computer, a goggle-type display, a projector, a mobile book, a digital camera, a car navigation device, and a personal computer.

* * * * *